(12) United States Patent
Lin et al.

(10) Patent No.: US 7,317,644 B1
(45) Date of Patent: Jan. 8, 2008

(54) SIGNAL TIMING FOR I/O

(75) Inventors: Guu Lin, San Jose, CA (US);
Stephanie T. Tran, San Jose, CA (US);
Yen-Fu Lin, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/303,250

(22) Filed: Dec. 15, 2005

(51) Int. Cl.
*G11C 7/00* (2006.01)

(52) U.S. Cl. .................. 365/194; 365/189.02; 365/233

(58) Field of Classification Search ........... 365/189.02, 365/194, 233
See application file for complete search history.

(56) References Cited

U.S. PATENT DOCUMENTS

| | | | |
|---|---|---|---|
| 6,614,371 B2* | 9/2003 | Zhang | 341/101 |
| 6,646,944 B2* | 11/2003 | Shimano et al. | 365/222 |
| 6,735,129 B2* | 5/2004 | Akasaki et al. | 365/194 |
| 7,026,850 B2* | 4/2006 | Atyunin et al. | 327/158 |
| 2005/0034006 A1* | 2/2005 | Schoenfeld et al. | 713/401 |

* cited by examiner

*Primary Examiner*—Hoai V. Ho
(74) *Attorney, Agent, or Firm*—Townsend and Townsend and Crew LLP

(57) ABSTRACT

Circuits, methods, and apparatus for ordering the timing of clock and data signals. Programmable delay cells are utilized in a data output cell to control a critical multiple data rate input/output write timing so the output can achieve better performance, such as higher maximum frequency of output (Fmax) performance. The delay cells ensure that critical timing criteria between clock signals and data high and low signals are satisfied so that there is a reduced chance of output glitching.

23 Claims, 7 Drawing Sheets

SIGNAL TIMING FOR I/O

BACKGROUND

The present invention relates generally to high-speed data interfaces and more particularly to circuitry for ordering clock edges at high-speed data interfaces.

Due to rapid progress in design techniques and process technology, the speed of integrated circuit (IC) devices has increased considerably. Such a rapid change in the speed of IC devices has also led to increasingly demanding requirements on the memory devices that interface with these IC's. Besides having a high storage capacity, modern memory chips must be able to interface with other chips at increasingly faster speeds. Consequently, the use of Double Data Rate (DDR) and Quadruple Data Rate (QDR) memory devices, or more generally a multiple data-rate interface, for faster speed has become increasingly common. A DDR interface is a synchronous (that is, clocked) interface where data is transferred on each edge of a clock signal. Specifically, alternating data bits in a DDR signal are transferred on the rising and falling edges of a clock signal, thereby doubling the peak throughput of the memory device without increasing the system clock frequency. Similar steps and results exist for Low Voltage Differential Signaling (LVDS).

During a DDR transfer from an IC (e.g. an FPGA or PLD) to a memory device for performing a write operation, different data signals are transmitted when the clock signal (CLK) value is 0, a data low (DL), and when it is 1, a data high (DH). The timing of these data signals must be correlated to the timing signal of the clock, which is used to select which data signal to send. The DL signal is transferred for the entire time that the clock signal is zero. The DH signal is transferred for the entire time that the clock signal is one.

The timings of the DL, DH, and CLK signals depend on each one's different routing path within the circuit. The different routing paths create differing delays in the signals. The different delays may cause a failure to satisfy the critical timing criteria, which ensure the proper data signal is selected for transfer to the memory device. This is particularly true when the circuit must be able to operate at varying external conditions (such as temperature) that can affect the delays associated with the different routing paths.

Thus, what are needed are circuits, methods, and apparatus for satisfying the critical timing restraints in an efficient and easily implemented method.

SUMMARY

Accordingly, embodiments of the present invention provide circuits, methods, and apparatus for ensuring critical timing criteria of an output cell are satisfied. One embodiment of the present invention uses a programmable delay element to adjust a clock signal such that the delayed clock signal is received by a signal selection circuit after a first data signal is received by the signal selection circuit. Additionally, another programmable delay element can be inserted to adjust a second data signal such that the delayed clock signal is received by a selection circuit before the delayed second data signal is received by the signal selection circuit.

A further embodiment of the present invention uses the delayed clock signal to select which data signal input to the signal selection circuit to output. Additionally, the clock signal may be used in conjunction with a timing device to generate the first and second data signals. Embodiments of the present invention may incorporate one or more of the these or the other features described herein.

A better understanding of the nature and advantages of the present invention may be gained with reference to the following detailed description and the accompanying drawings.

DESCRIPTION OF EXEMPLARY EMBODIMENTS

Embodiments of the present invention are directed to double data rate input/output (DDIO) circuits used, for example, to transmit data from to a memory chip. Generally, the data is produced by a programmable logic device (PLD) such as field programmable gate arrays (FPGA). DDIO circuits are also used for low voltage differential signaling (LVDS) and clock outputs generation. As described herein, a clock signal is generally referred to as a periodic signal or timing signal used for the operation of digital circuitry such as the PLD. However, one skilled in the art will appreciate that embodiments of the invention may be applied to other types of signals, including analog signals, signals that differ in frequency, etc.

Figure 1:
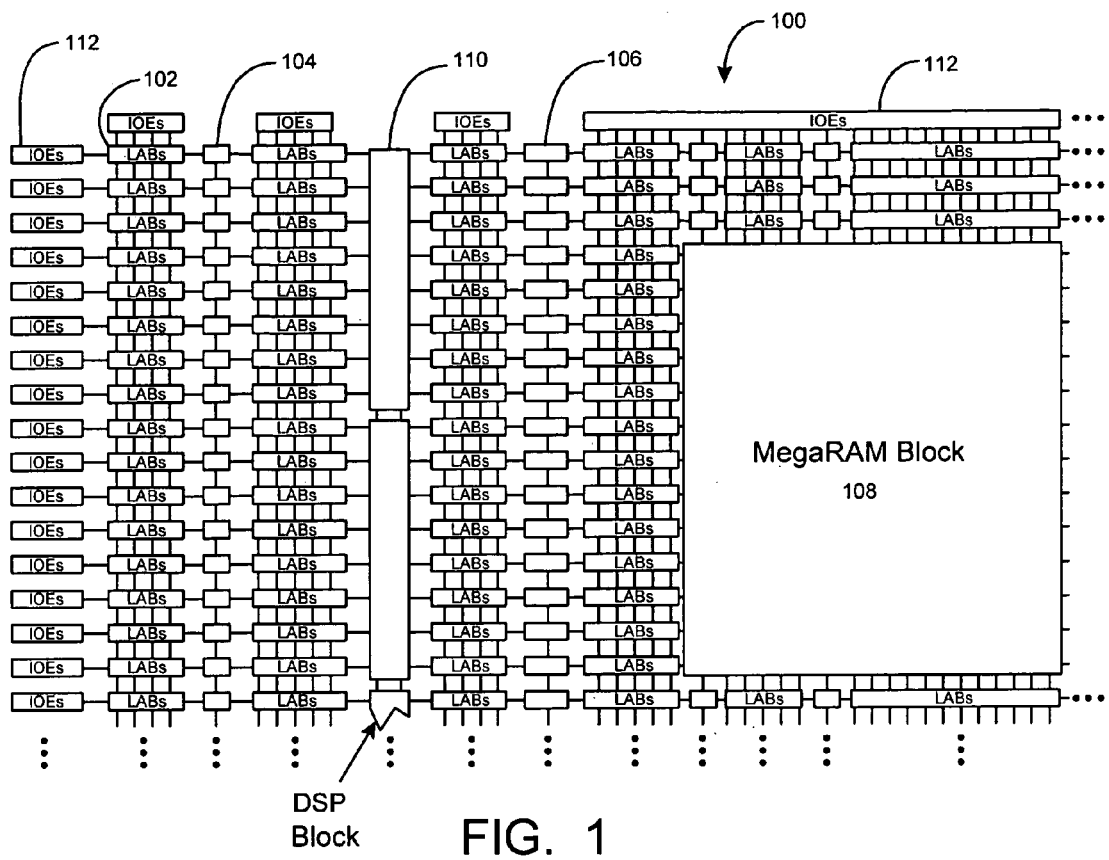
FIG. 1 is a simplified block diagram of a programmable logic device that does benefit by incorporating embodiments of the present invention.

FIG. 1 is a simplified partial block diagram of an exemplary high-density programmable logic device 100 wherein techniques according to the present invention can be utilized. PLD 100 includes a two-dimensional array of programmable logic array blocks (or LABs) 102 that are interconnected by a network of column and row interconnections of varying length and speed. LABs 102 include multiple (e.g., 10) logic elements (or LEs), an LE being a small unit of logic that provides for efficient implementation of user defined logic functions.

PLD 100 also includes a distributed memory structure including RAM blocks of varying sizes provided throughout the array. The RAM blocks include, for example, 512 bit blocks 104, 4K blocks 106 and an M-Block 108 providing 512K bits of RAM. These memory blocks may also include shift registers and FIFO buffers. PLD 100 further includes digital signal processing (DSP) blocks 110 that can implement, for example, multipliers with add or subtract features.

It is to be understood that PLD 100 is described herein for illustrative purposes only and that the present invention can be implemented in many different types of PLDs, FPGAs, and the other types of digital integrated circuits.

Figure 2:
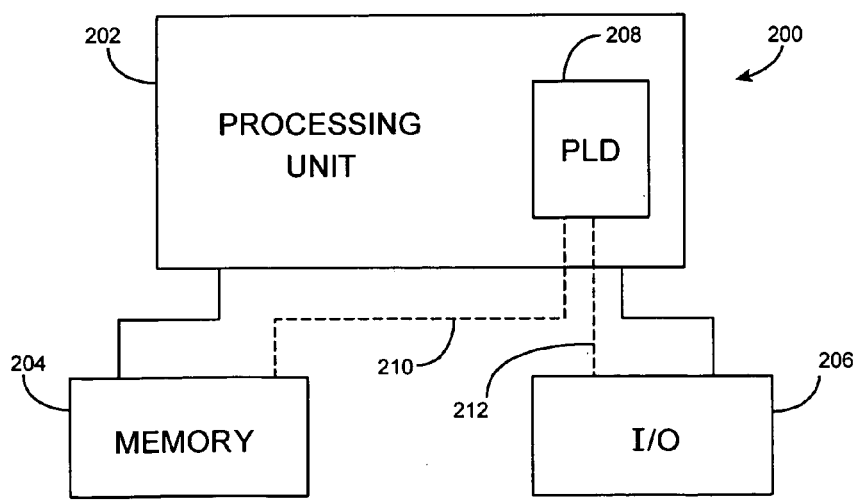
FIG. 2 is a block diagram of an electronic system that does benefit by incorporating embodiments of the present invention.

While PLDs of the type shown in FIG. 1 provide many of the resources required to implement system level solutions, the present invention can also benefit systems wherein a PLD is one of several components. FIG. 2 shows a block diagram of an exemplary digital system 200, within which the present invention may be embodied. System 200 can be a programmed digital computer system, digital signal processing system, specialized digital switching network, or other processing system. Moreover, such systems may be designed for a wide variety of applications such as telecommunications systems, automotive systems, control systems, consumer electronics, personal computers, electronic displays, Internet communications and networking, and others. Further, system 200 may be provided on a single board, on multiple boards, or within multiple enclosures.

System 200 includes a processing unit 202, a memory unit 204 and an I/O unit 206 interconnected together by one or more buses. According to this exemplary embodiment, a programmable logic device (PLD) 208 is embedded in processing unit 202. PLD 208 may serve many different purposes within the system in FIG. 2. PLD 208 can, for example, be a logical building block of processing unit 202, supporting its internal and external operations. PLD 208 is programmed to implement the logical functions necessary to carry on its particular role in system operation. PLD 208 may be specially coupled to memory 204 through connection 210 and to I/O unit 206 through connection 212.

Processing unit 202 may direct data to an appropriate system component for processing or storage, execute a program stored in memory 204 or receive and transmit data via I/O unit 206, or other similar function. Processing unit 202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 208 can control the logical operations of the system. In an embodiment, PLD 208 acts as a reconfigurable processor, which can be reprogrammed as needed to handle a particular computing task. Alternately, programmable logic device 208 may itself include an embedded microprocessor. Memory unit 204 may be a random access memory (RAM), read only memory (ROM), fixed or flexible disk media, PC Card flash disk memory, tape, or any other storage means, or any combination of these storage means.

Embodiments of the present invention may be used to improve circuits that interface with the memory unit 204. While embodiments of the present invention particularly benefit these interface circuits when memory unit 204 is a double-data rate (DDR) type memory, embodiments may benefit other multiple-data rate types interfaces that are either now known or later developed.

Figure 3:
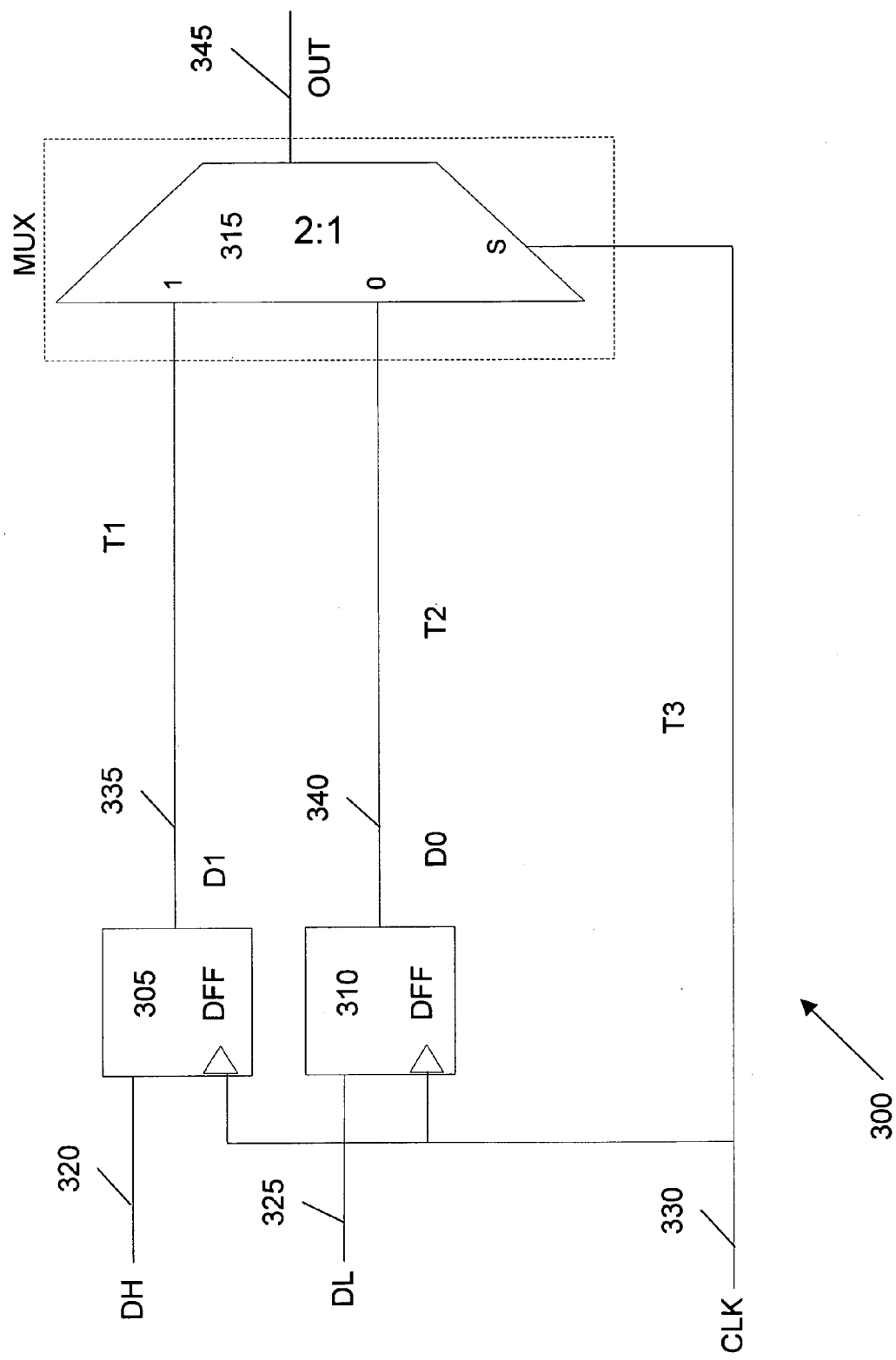
FIG. 3 is a schematic of high speed data output circuitry that is improved by incorporating an embodiment of the present invention.

FIG. 3 is a schematic of a high speed output data cell that can send data to a memory device and that is improved by incorporating an embodiment of the present invention. This schematic includes an output cell 300 including D flip-flops (DFF) 305 and 310, and multiplexer (MUX) 315. This figure, as with the other included figures, is shown for illustrative purposes and does not limit either the possible embodiments of the present invention or the claims.

Single data rate signals DH and DL are respectively received on lines 320 and 325 into flip flops 305 and 310. The clock signal CLK on line 330 clocks flip-flops 305 and 310 on its rising edge. In other embodiments, a falling edge could be used. Flip-flop 305 provides data output D1 on line 335, and flip-flop 310 provides data output D0 on line 340. The multiplexer 315 receives D1 at input MUX 1, D0 at input MUX 0, and the CLK signal at the data select input MUX S. In this embodiment, the MUX 1 signal is transmitted through the OUT of the multiplexer on line 345 while the MUX S signal is 1, and the MUX 0 signal is transmitted while the MUX S signal is 0. The data rates of the data signals DH, DL, D1, and D0 operate at one-half the frequency of the data rate of the OUT signal.

Timing delays T1, T2, and T3 are associated with the times for the different electric signals D1, D0, and CLK to reach the multiplexer 315 as measured from the leading edge of the CLK signal on line 330. The delays can be due to a relatively significant transmission time of the electric signals through wires and logic elements. The significant transmission time can be attributed in part to the length of wire and the distributed capacitance and resistance of the wires and the circuit. Specifically, T1 is the delay for the D1 output from flip-flop 305 to reach input MUX 1 of multiplexer 315; T2 is the delay for the D0 output from flip-flop 310 to reach input MUX 0; and T3 is the delay for the CLK signal on line 330 to reach input MUX S.

In order for the OUT signal on line 345 to be accurate at all times, the timing criteria T1<T3 <T2 must be satisfied. This timing criteria ensures proper synchronization of the data signals D1 and D0, generated from DH and DL, with the signals generated from the CLK signal in order to form an OUT signal temporally consistent with the values in DH and DL. If this timing criteria is not met, a glitch may be generated at the OUT node. The critical timing is most closely associated with the leading 0→1 edge of the CLK signal since data is being switched at the flip-flops 305 and 310 on this edge. In this embodiment, the CLK switch from 1→0 is less critical, since there's no data switching at a flip-flop on the CLK falling edge. If the flip-flops were clocked on a falling edge then the reverse would be true.

Figure 4:
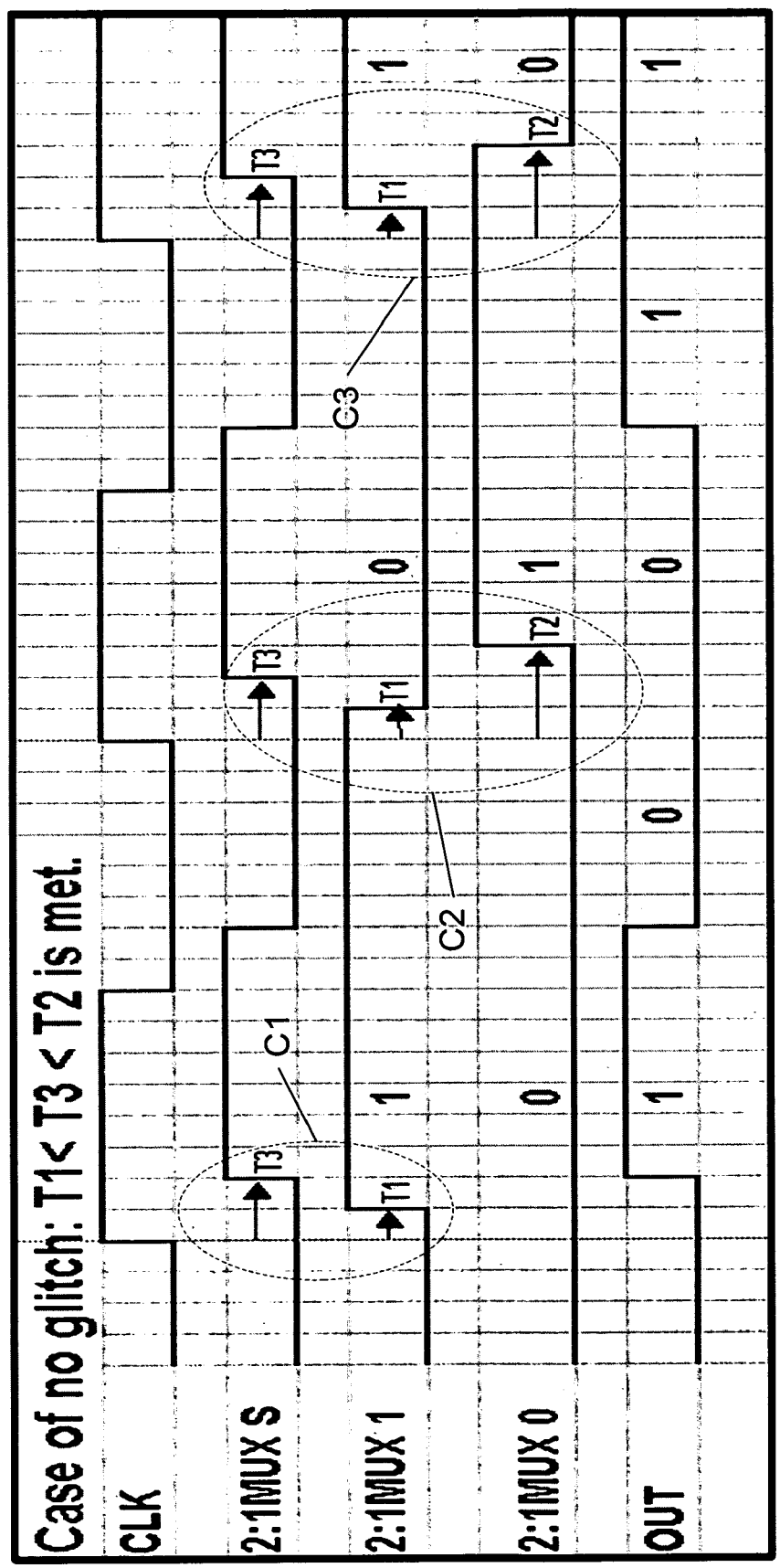
FIG. 4 is an exemplary timing diagram of the circuitry of FIG. 3 where a timing criteria is satisfied.

FIG. 4 shows a timing diagram when the T1<T3<T2 criteria is met. The timing delays are measured from the leading edge of the CLK signal which triggers the flip-flops 305 and 310 to transmit D1 and D0. In the first cluster C1 of timings, the 0→1 transition of D1 is received in MUX 1 before the CLK signal is received into the data select input MUX S, which is a result of T1<T3. Thus, starting at T3, the multiplexer OUT is the input of MUX 1 which is receiving properly timed D1 data. Then, starting with the 1→0 transition of the CLK signal received at MUX S, the "0" value of D0 at the input MUX 0 is properly selected for the OUT node.

At the second cluster C2 of timings, OUT properly stays "0" throughout the critical timing period. Since T3<T2, the 0→1 transition of D0 reaches MUX 0 after the CLK signal going from 0→1 reaches MUX S selecting the MUX 1 input signal. Thus, the input signal into MUX 0 stays "0" while the signal into MUX 0 is selected for the OUT node. Since T1<T3, the 1→0 transition of D1 reaches MUX 1 before the CLK signal going from 0→1 reaches MUX S. Thus, a "0" is being input into MUX 1 when it is selected for transfer to OUT. Both of these satisfied criteria cause OUT to properly stay at "0".

At the third cluster C3 of timings, OUT properly stays "1" throughout the critical timing period. Since T3<T2, the 1→0 transition of D0 reaches MUX 0 after the CLK signal going from 0→1 reaches MUX S selects the MUX 1 input signal. Thus, the input signal into MUX 0 stays "1" while the signal into MUX 0 is selected for the OUT node. Since T1<T3, the 0→1 transition of D1 reaches MUX 1 before the CLK signal going from 0→1 reaches MUX S. Thus, a "1" is being input into MUX 1 when it is selected for transfer to OUT. Both of these satisfied criteria cause OUT to properly stay at "1".

There does exist an upper bound on the value of T2. If T2 is greater than T3 plus one-half the period of the CLK cycle, then it is possible for the signal of D0 to not have reached MUX 0 in sufficient time.

Figure 5:
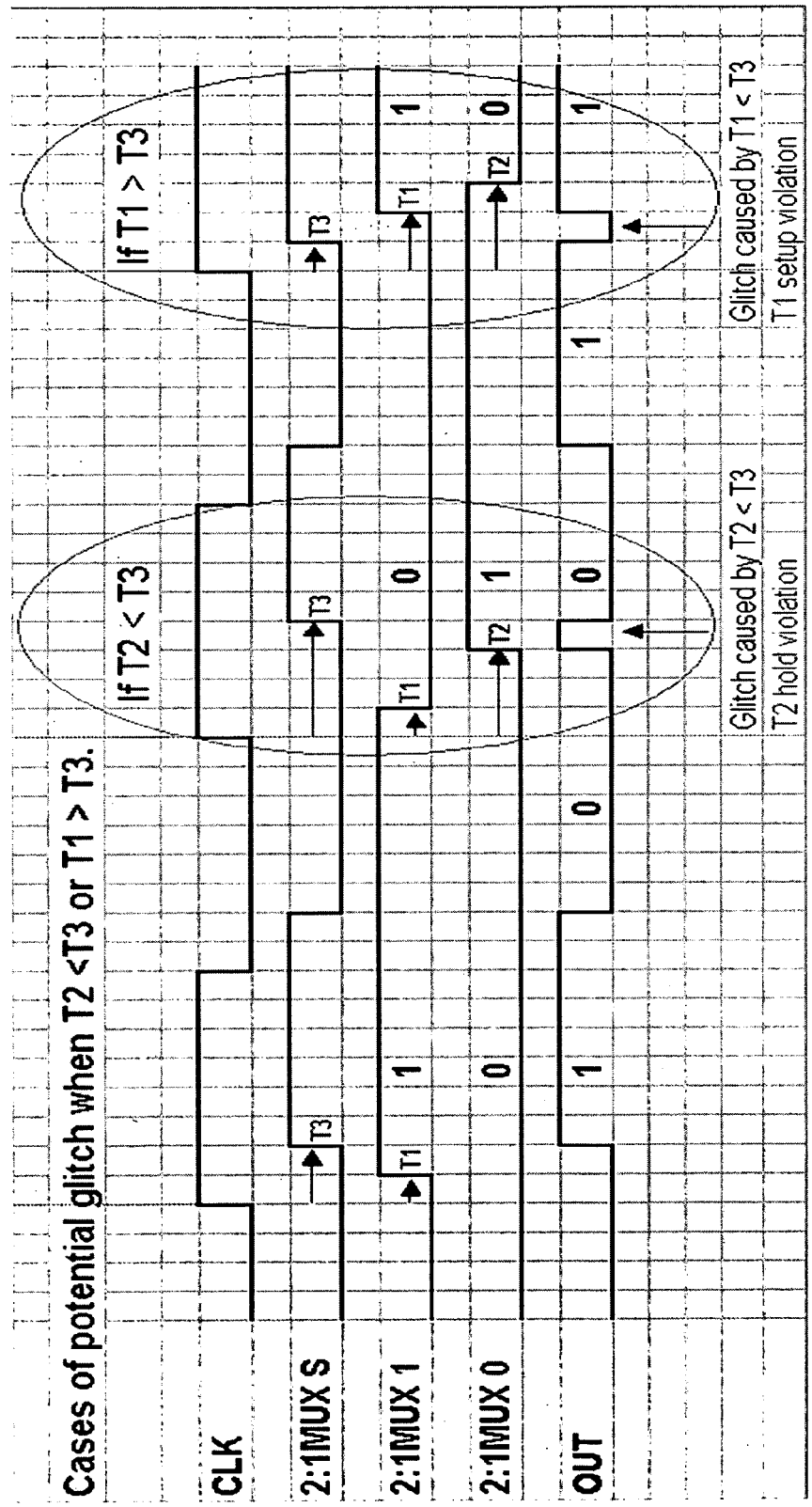
FIG. 5 is a an exemplary timing diagram of the circuitry of FIG. 3 where a timing criteria is not satisfied.

FIG. 5 shows two scenarios when the timing criteria is not met. In the case where, T2<T3 (T2 hold violation), the transition of D0 from 0→1 reaches MUX 0 before the CLK signal transition from 0→1 reaches MUX S, which ends the selection of MUX 0 to OUT. Thus, the signal into MUX 0 improperly changes while MUX S is selecting MUX 0 for transmission though OUT. Essentially, the data signal D0 into MUX 0 is temporally incorrect as it arrives too quickly (T2 is too small), or conversely the select signal MUX S is choosing the wrong input data signal to transfer to OUT for the time (T3-T2) because T3 is too large.

In the case where T1>T3 (T1 setup violation), the transition of D1 from 0→1 reaches MUX 1 after the CLK signal transition from 0→1 reaches MUX S, which starts the selection of MUX 1 to OUT. Thus, MUX 1 is "0" for the time (T1-T3), and then is "1" thereafter. The signal into MUX 1 improperly changes while MUX S is selecting MUX 1 for transmission though OUT. The data signal into MUX 1 is temporally incorrect as it arrives too late (T1 is too large), or conversely the select signal MUX S is choosing the wrong input data signal to transfer to OUT for the time (T1-T3) because T3 is too small.

These two instances of glitches in the timing of the output of a DDR data signal may hurt the output data eye diagram thus degrading output Fmax performance and may even cause the wrong information to be received by a memory device, such as 204. The memory device would then the wrong data, thus corrupting future processes by a PLD and/or processing unit.

Figure 6:
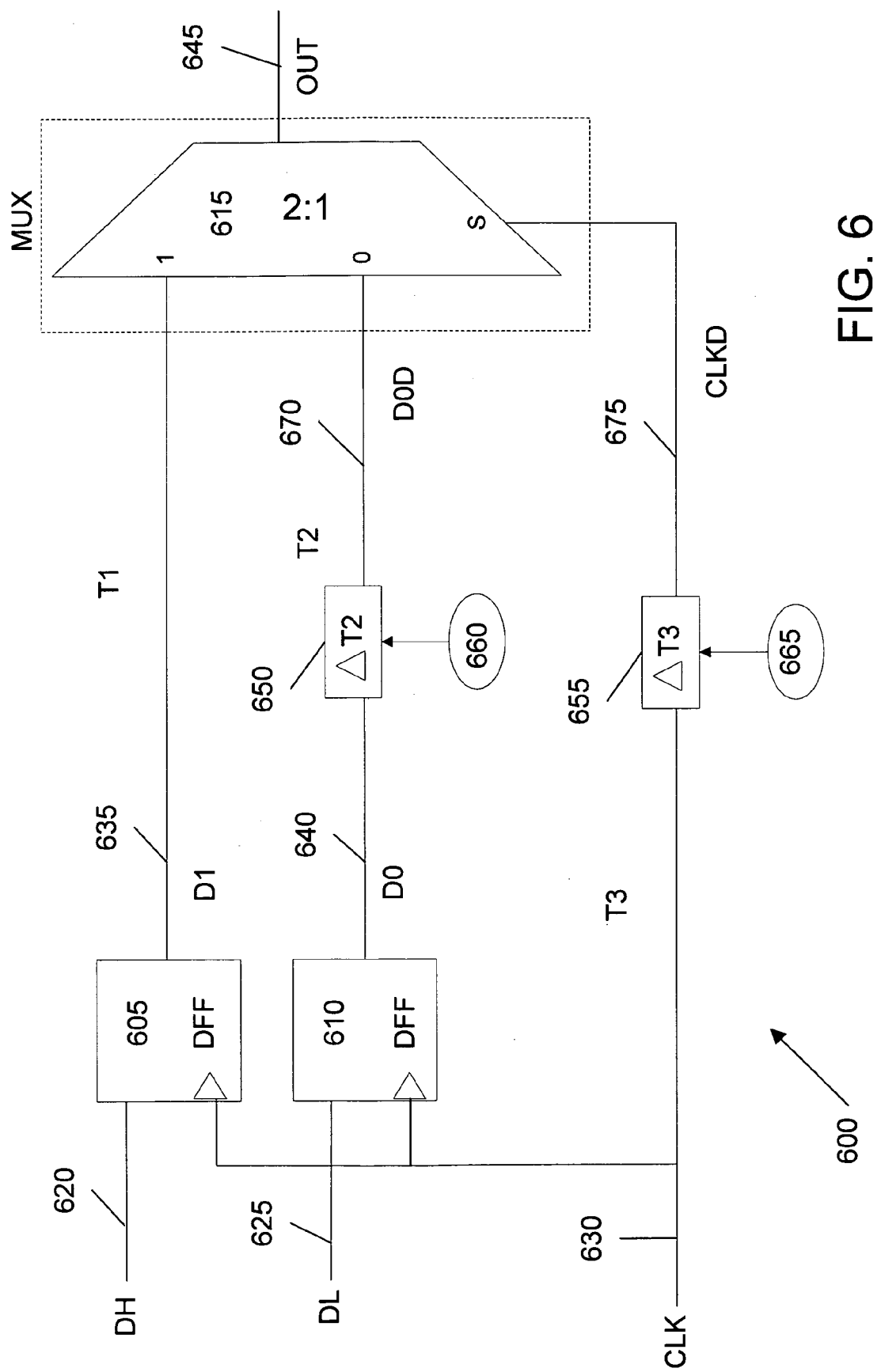
FIG. 6 is a schematic of high speed data output circuitry according to an embodiment of the present invention.

FIG. 6 is a schematic of an embodiment of the present invention. The schematic includes flip-flops 605 and 610, and multiplexer (MUX) 615. To control the delay more flexibly for T3 and T2, programmable delays 650 and 655 are added on the T2 and T3 paths. In some embodiments, the amount of delay is related to values stored by CRAM bits 660 and 665. Alternatively, the CRAM bits could be any type of memory device, such as flash memory, RAM, EPROM, EEPROM, registers, or other storage circuit. The relation of the amount of delay to values stored in a memory device may be one where the delay is directly or inversely proportional the values stored in the memory device.

Single data rate signals DH and DL are respectively received on lines 620 and 625 into flip flops 605 and 615. The clock signal CLK on line 630 clocks flip-flops 605 and 610 on its rising edge. In other embodiments, a falling edge could also be used. Flip-flop 605 provides data output D1 on line 635, and flip-flop 610 provides data output D0 on line 640.

The data signal D0 on line 640 is delayed by delay element 650 which provides an output DOD on line 670. The duration ΔT2 of delay is related to CRAM bits 660 connected to delay element 650. The CLK signal on line 630 is delayed by delay element 655 which provides an output CLKD on line 675. The duration ΔT3 of delay is related to CRAM bits 665 connected to delay element 655.

The multiplexer receives D1 at input MUX 1, D0D at input MUX 0, and the CLKD signal at the data select input MUX S. In this embodiment, the MUX 1 signal is transmitted through the OUT of the multiplexer on line 645 while the MUX S signal is 1, and the MUX 0 signal is transmitted while the MUX S signal is 0. The data rates of the data signals DH, DL, D1, and D0 operate at one-half the frequency of the data rate of the OUT signal.

Since the 1→0 falling edge of CLK is less critical, T2 generally just needs to be sufficiently long, which gives a relatively large window of acceptable timings. Although T2 is bounded by a maximum related to the period of CLK (about one-half of the period), this bound should practically never be realized.

By selecting a proper setting of the delay for T3 and T2, the T1<T3<T2 criteria is ensured to be satisfied. The programmable delay can be designed to any range per design requirement. For example, it could vary from 100 ps to 250 ps at typical condition. By avoiding the potential glitch at DDIO caused by a T1<T3<T2 violation, the output performance such as maximum frequency of oscillation (Fmax), duty cycle and eye diagram will be improved.

One skilled in the art will appreciate alternative circuits in which embodiments of the invention encompass. For example, flip-flops 605 and 610 can be any general timing device that can be clocked, such as a latch, retiming circuit, storage element, or FIFO device. Also, the multiplexer MUX can be any general selection circuit composed of, for example, logic gates, tristate gates, pass gates, or pass devices.

Figure 7:
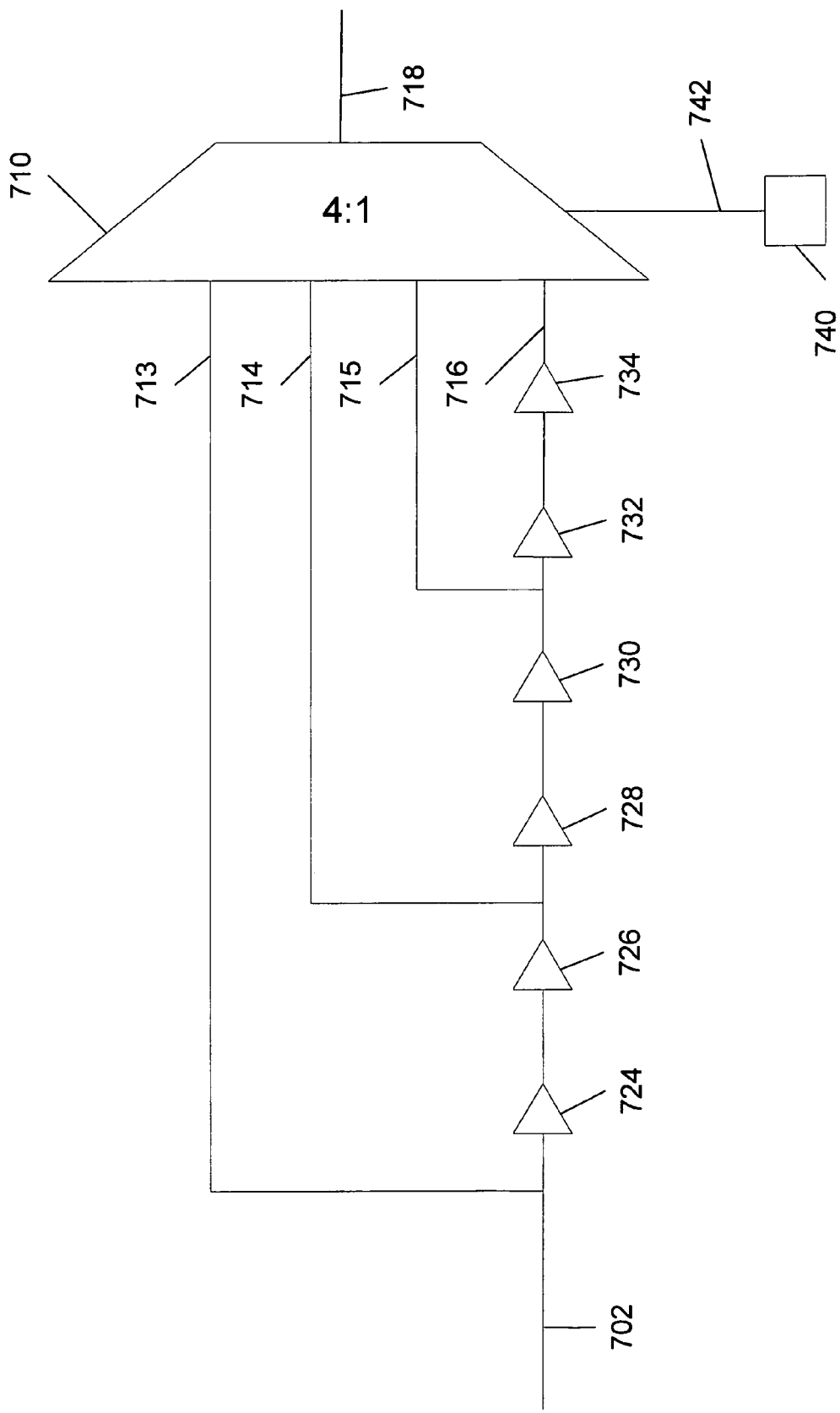
FIG. 7 is a schematic of a delay element that may be used as the delay elements in FIG. 6 or as a delay element in other embodiments of the present invention.

FIG. 7 is a schematic of a delay element that may be used as the delay elements in FIG. 6 or as a delay element in other embodiments of the present invention. This delay element includes buffers, inverters, or delay circuits 724, 726, 728, 730, 732, and 734, as well as multiplexer 710, and memory locations 740.

The signal to be delayed is received on line 702 and delayed by the series of delay circuits. Occasional outputs from this series are provided as inputs to multiplexer 710. The multiplexer 710 selects one of these inputs and provides an output signal on line 718. For example, for a minimum delay, the signal on line 702 is selected by multiplexer 710 and provided as an output on line 718. For a maximum delay, the signal on line 716 is selected by multiplexer 710 and provided as an output on line 718. The memory locations 740 provide signals on lines 742 to the multiplexer 710. These bits control which input to the multiplexer is provided as an output on line 718. The bits in memory may be constant or new values may be input while the circuit operates.

In other embodiments, a delay element may be any series of inverters, an RC delay having a number of switched elements, or other circuit which allows for a programmable delay of a signal.

Figure 8:
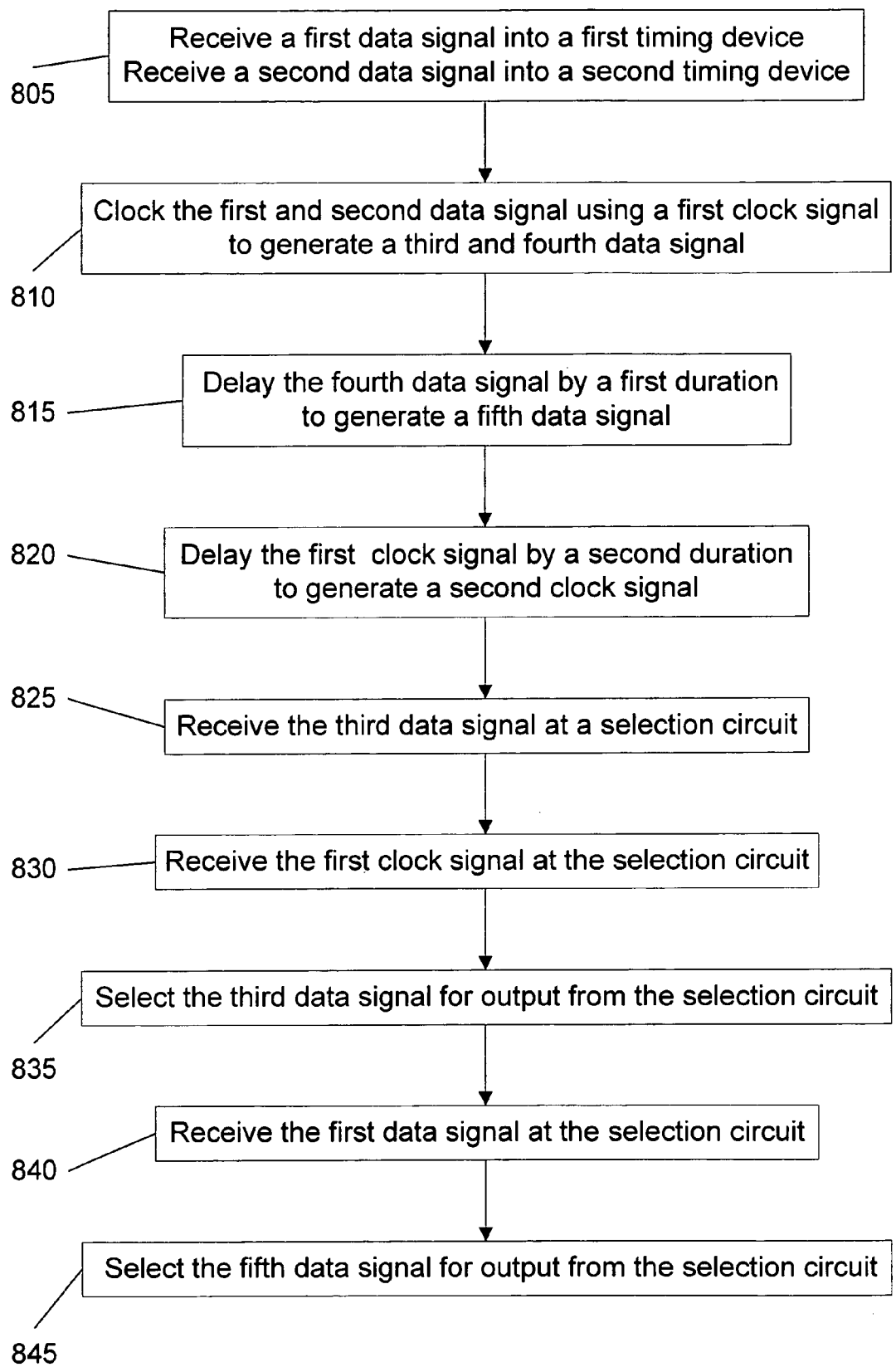
FIG. 8 is a flow chart illustrating a method of adjusting the timing of an output cell according to an embodiment of the present invention.

FIG. 8 is a flow chart illustrating a method of ensuring timing criteria is met according to an embodiment of the present invention. In act 805, a first data signal is received into a first timing device, and a second data signal is received into a second timing device. In act 810, the first and second data signals are clocked using a first clock signal to generate respectively a third and fourth data signal. The fourth data signal is delayed a first duration to generate a fifth data signal in act 815. The first clock signal is delayed a second duration to generate a second clock signal in act 820. In act 825, the third data signal is received at a selection circuit. In act 830, the second clock signal is received at the selection circuit. In act 835, the third data signal is selected for transmission from the selection circuit to an output signal based on the second clock signal. In act 840, the fifth signal is received at the selection circuit. In act 845, the fifth data signal is selected for transmission from the selection circuit to an output signal based on the second clock signal.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
    a signal selection circuit having at least two data inputs, the signal selection circuit having an output selectively coupled to one of the at least two data inputs in response to a data select input;
    a first delay circuit having an output coupled to a first input of the at least two data inputs of the signal selection circuit, wherein a first duration of the first delay circuit is related to a numerical value stored in a first memory device connected to the first delay circuit; and
    a second delay circuit having an output coupled to the data select input of the signal selection circuit, wherein a second duration of the second delay circuit is related to a numerical value stored in a second memory device connected to the second delay circuit,
    wherein a rising edge in an output signal of the first delay circuit occurs after a corresponding rising edge in an output signal of the second delay circuit.

2. The integrated circuit of claim 1, wherein the relations of the first and second durations to the numerical values stored in the first and second memory devices are direct or inverse proportionality.

3. The integrated circuit of claim 1, wherein the second duration is such that the output of the second delay circuit is received by the signal selection circuit after a data signal coupled to a second input of the at least two data inputs of the signal selection circuit.

4. The integrated circuit of claim 3 wherein the first and second durations are such that the output of the second delay circuit is received by the signal selection circuit before the output of the first delay circuit.

5. The integrated circuit of claim 1 wherein an input of the first delay circuit is coupled to an output of a first timing circuit.

6. The integrated circuit of claim 5, wherein an input of the second delay circuit is coupled to an input the first timing circuit.

7. The integrated circuit of claim 5, further comprising:
    a second timing circuit having an output coupled to a second input of the at least two data inputs of the signal selection circuit.

8. The integrated circuit of claim 7, wherein the second duration is such that the output of the second timing circuit is received by the signal selection circuit before the output of the second delay circuit.

9. The integrated circuit of claim 1, wherein the first memory device is CRAM, RAM, flash memory, EPPROM, or EEPROM.

10. The integrated circuit of claim 7, wherein the first timing circuit and the second timing circuit are flip-flops.

11. The integrated circuit of claim 10, wherein the flip-flops are D flip-flops.

12. The integrated circuit of claim 7, wherein the first timing circuit and second timing circuit are part of a double data-rate input cell.

13. The integrated circuit of claim 12, wherein the integrated circuit is a field programmable gate array.

14. An integrated circuit comprising:
    a signal selection circuit having at least two data inputs, the signal selection circuit having an output selectively coupled to one of the at least two data inputs in response to a data select input;
    a first delay circuit having an output coupled to a first input of the at least two data inputs of the signal selection circuit; and
    a second programmable delay circuit having an output coupled to the data select input of the signal selection circuit,
    wherein an input of the first delay circuit is coupled to an output of a first timing circuit.

15. The integrated circuit of claim 14, wherein the first delay circuit is a programmable delay circuit.

16. The integrated circuit of claim 14, wherein the output of the second delay circuit is received by the signal selection circuit after a data signal coupled to a second input of the at least two data inputs of the signal selection circuit.

17. The integrated circuit of claim 16, wherein the output of the second delay circuit is received by the signal selection circuit before the output of the first delay circuit.

18. The integrated circuit of claim 14, wherein an input of the second delay circuit is coupled to an input the first timing circuit.

19. The integrated circuit of claim 14, further comprising:
    a second timing circuit having an output coupled to a second input of the at least two data inputs of the signal selection circuit.

20. A method of sending a data output signal comprising:
    delaying a first data signal a first duration with a first delay circuit generating a second data signal, wherein the first duration is related to a numerical value stored in a first memory device connected to the first delay circuit;
    delaying a first clock signal a second duration with a second delay circuit generating a second clock signal, wherein the second duration is related to a numerical value stored in a second memory device connected to the second delay circuit;
    receiving the second clock signal into a signal selection circuit;
    receiving a third data signal into the signal selection circuit;
    receiving the second data signal into the signal selection circuit;
    timing a fourth data signal using a first edge of the first clock signal to generate the first data signal; and
    timing a fifth data signal using the first edge of the first clock signal to generate the third data signal.

21. The method of claim 20, wherein the second duration is such that the third data signal is received into the signal selection circuit before the second clock signal.

22. The method of claim 20, further comprising:
    selecting, based on the second clock signal, a signal from a group of data signals input into the selection circuit; and
    outputting the selected signal from the signal selection circuit.

23. The method of claim 20, wherein the first and second durations are such that the second data signal is received into the signal selection circuit after the second clock signal.

* * * * *